United States Patent [19]
Takasaki

[11] Patent Number: 6,157,904
[45] Date of Patent: Dec. 5, 2000

[54] HARDWARE SIMULATOR CAPABLE OF DEALING WITH A DESCRIPTION OF A FUNCTIONAL LEVEL

[75] Inventor: Shigeru Takasaki, Tokyo, Japan

[73] Assignee: NEC Corporation, Tokyo, Japan

[21] Appl. No.: 08/432,270

[22] Filed: May 1, 1995

Related U.S. Application Data

[62] Division of application No. 08/074,725, Jun. 10, 1993, Pat. No. 5,572,708, which is a continuation of application No. 07/486,705, Feb. 28, 1990, abandoned.

[30] Foreign Application Priority Data

| Feb. 28, 1989 | [JP] | Japan | 1-48225 |
| May 24, 1989 | [JP] | Japan | 1-131079 |
| Jun. 30, 1989 | [JP] | Japan | 1-166926 |
| Dec. 7, 1989 | [JP] | Japan | 1-318102 |

[51] Int. Cl.$^7$ ............................................ G06F 9/44
[52] U.S. Cl. .............................. 703/26; 703/28; 703/14
[58] Field of Search ........................... 364/578, 488, 364/489, 490; 395/800, 500, 375; 703/26, 28, 27, 14

[56] References Cited

U.S. PATENT DOCUMENTS

| 4,242,675 | 12/1980 | Boone et al. ............................. 340/711 |
| 4,306,286 | 12/1981 | Cocke et al. ............................. 395/800 |
| 4,527,249 | 7/1985 | Van Brunt ............................... 364/578 |
| 4,541,071 | 9/1985 | Ohmori .................................... 395/775 |
| 4,590,581 | 5/1986 | Widdoes, Jr. ............................. 364/578 |
| 4,656,580 | 4/1987 | Hitchcock, Sr. et al. ............... 395/500 |
| 4,725,975 | 2/1988 | Sasaki ..................................... 395/500 |
| 4,775,950 | 10/1988 | Terada et al. ............................ 364/578 |
| 4,782,440 | 11/1988 | Nomizu et al. .......................... 395/500 |
| 4,882,690 | 11/1989 | Shinsha et al. ........................... 364/490 |
| 4,918,594 | 4/1990 | Onzuka .................................... 395/500 |
| 5,282,146 | 1/1994 | Aihara et al. ............................ 364/489 |

OTHER PUBLICATIONS

Augustin et al., "Verification of VHDL Desing Using VAL," AMC/IEEE 1988, pp. 48–53.

*Primary Examiner*—Kevin J. Teska
*Assistant Examiner*—Thai Phan
*Attorney, Agent, or Firm*—Sughrue, Mion, Zinn, Macpeak & Seas, PLLC

[57] ABSTRACT

In a logic simulator for simulating a logic circuit described by sentences, each specifying at least one operation and at least two variables which should be subjected to the operation, a model memory memorizes operators for carrying out the operations for the sentences. A variable memory memorizes initial values of the variables for the sentences. A sentence calculating unit calculates one of the sentences as a current sentence at a time to produce a result of calculation by using those of the operators and the initial values which are related to the current sentence. A data or result memory memorizes previous data or initial result values calculated before calculation of the current sentence. The result of calculation is substituted for those of the previous data or the initial result values which are related to the current sentences. Preferably, a flag memory is used to memorize, in correspondence to the respective sentences, flags indicative of whether or not the initial values are changed while simulation is in progress. One of the sentences is selected as the current sentence only when the flag indicates a change for the sentence in question. More preferably, the sentence calculating unit is accompanied by the input and output first-in first-out memories for enabling calculation of a plurality of successive ones of the sentences.

6 Claims, 16 Drawing Sheets

D = A * B + C ⟶

| STEP | CODE | CONTENT |
|---|---|---|
| S1: | GET A | --- READ-OUT OF A |
| S2: | GET B | --- READ-OUT OF B |
| S3: | AND | --- EXECUTION OF A*B |
| S4: | GET C | --- READ-OUT OF C |
| S5: | OR | --- EXECUTION OF A*B+C |
| S6: | EXIT | --- STORAGE OF A RESULT |

| STEP | CODE | CONTENT |
|---|---|---|
| S1: | GET A | --- READ-OUT OF A |
| S2: | GET B | --- READ-OUT OF B |
| S3: | AND | --- EXECUTION OF A*B |
| S4: | GET C | --- READ-OUT OF C |
| S5: | GET D | --- READ-OUT OF D |
| S6: | AND | --- EXECUTION OF C*D |
| S7: | GET E | --- READ-OUT OF E |
| S8: | GET F | --- READ-OUT OF F |
| S9: | AND | --- EXECUTION OF E*F |
| S10: | GET G | --- READ-OUT OF G |
| S11: | OR | --- EXECUTION OF E*F+G |
| S12: | OR | --- EXECUTION OF C*D+E*F+G |
| S13: | OR | --- EXECUTION OF A*B+C*D+E*F+G |
| S14: | EXIT | --- STORAGE OF A RESULT |

S1: GET A,B,C,D,E,F,G --- READ-OUT OF
                          A,B,C,D,E,F, & G

S2: FAU --------------- EXECUTION OF
                          A*B, C*D, E*F, & G

S3: FAU --------------- EXECUTION OF
                          A*B+C*D+E*F+G

S4: EXIT -------------- STORAGE OF A RESULT

MEM M(O=1024,O=16) = IF RE THEN READ AT ADR;

|  | CODE | CONTENT |
|---|---|---|
| S1: | GET RE | READ-OUT OF RE |
| S2: | TRN 1 | IF RE IS "1", OPERATION PROCEEDS TO S3. OTHERWISE, OPERATION PROCEEDS TO S5. |
| S3: | GET ADR | READ-OUT OF ADR |
| S4: | RAT | READ-OUT OF DATA AT AN ADDRESS ADR |
| S5: | EXIT | STORAGE OF A RESULT |

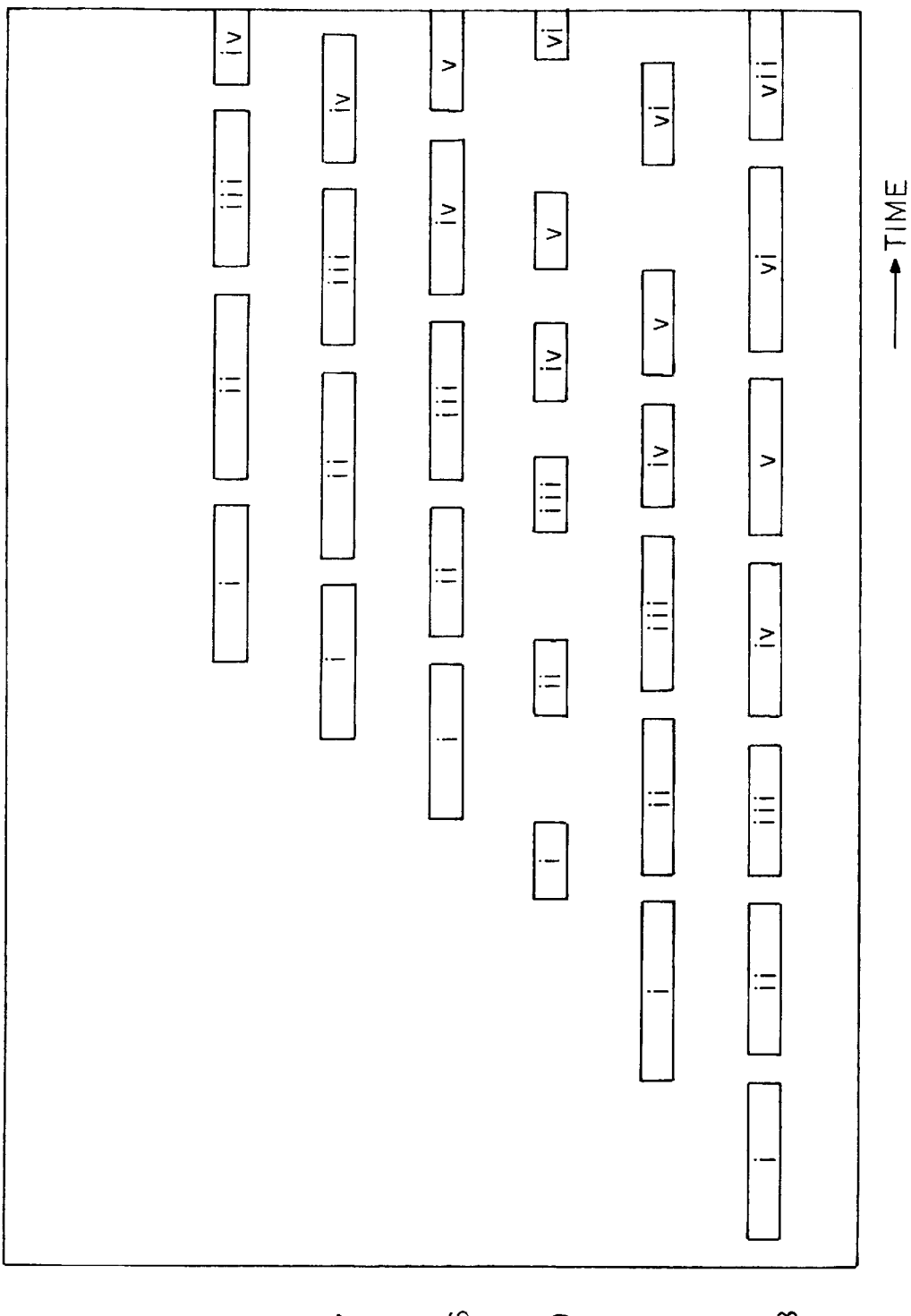

HARDWARE SIMULATOR CAPABLE OF DEALING WITH A DESCRIPTION OF A FUNCTIONAL LEVEL

This is a divisional of application Ser. No. 08/074,725 filed Jun. 10, 1993, now U.S. Pat. No. 5,572,708, which is a continuation of application Ser. No. 07/486,705 filed Feb. 28, 1990 (now abandoned).

BACKGROUND OF THE INVENTION

This invention relates to a logic simulator for use in carrying out logic simulation of a simulation model of a logic circuit.

Such logical simulation of the simulation model is effective in designing logic circuits. The logical simulation is generally carried out by the use of software and is therefore software simulation in the art. The software simulation must actually be carried out in sequence for individual functional operators of a description descriptive of the simulation model. The sequential simulation requires a long simulation time. Such a simulation time is enormously long when the simulation model is, for example, a large scale logic circuit.

As a logic simulator which can shorten the simulation time, a hardware tool is proposed for use in simulating the simulation model. The hardware tool is called a hardware simulator in the art. As the hardware simulator, a dynamic gate array is disclosed by Kenji Ohmori in U.S. Pat. No. 4,541,071 assigned to the instant assignee. The hardware simulator is for use in simulating an overall operation which is carried out by a gate assembly comprising a plurality of gates. With this hardware simulator, each logic operation of the gates is simulated in consideration of those logic states of each gate which are determined by permutations. Thus, the hardware simulator can deal with the description on a gate level. However, no disclosure is made in the Ohmori Patent about dealing with the description of a functional level.

SUMMARY OF THE INVENTION

It is therefore an object of this invention to provide a logic simulator which serves as a hardware simulator and which can deal on a functional level with a description descriptive of a logic circuit.

Other objects of this invention will become clear as the description proceeds.

According to this invention, there is provided a logic simulator comprising: a model memory for memorizing a plurality of operators for carrying out operations specified by sentences, a variable memory for memorizing a plurality of initial values of variables specified by the sentences; a sentence calculator connected to the model memory and the variable memory for calculating a sentence as a current sentence and producing a result of calculation by using at least one operator specified by the current sentence and at least two initial values specified in the current sentence; a data memory connected to the sentence calculator for memorizing previous data calculated by the sentence calculator; and substituting means connected to the sentence calculating means and data memory, for substituting the result of calculation for previous data that was previously calculated in compliance with a sentence then a current sentence.

BRIEF DESCRIPTION OF THE DRAWING

FIG. 3 is a diagram for use in describing operation of the logic simulator illustrated in FIG. 1;

FIG. 5 is another diagram for use in describing operation of the logic simulator illustrated in FIG. 1;

FIG. 18 is a diagram for use in describing operation of the logic simulator illustrated in FIG. 15.

DESCRIPTION OF THE PREFERRED EMBODIMENTS

Figure 1:
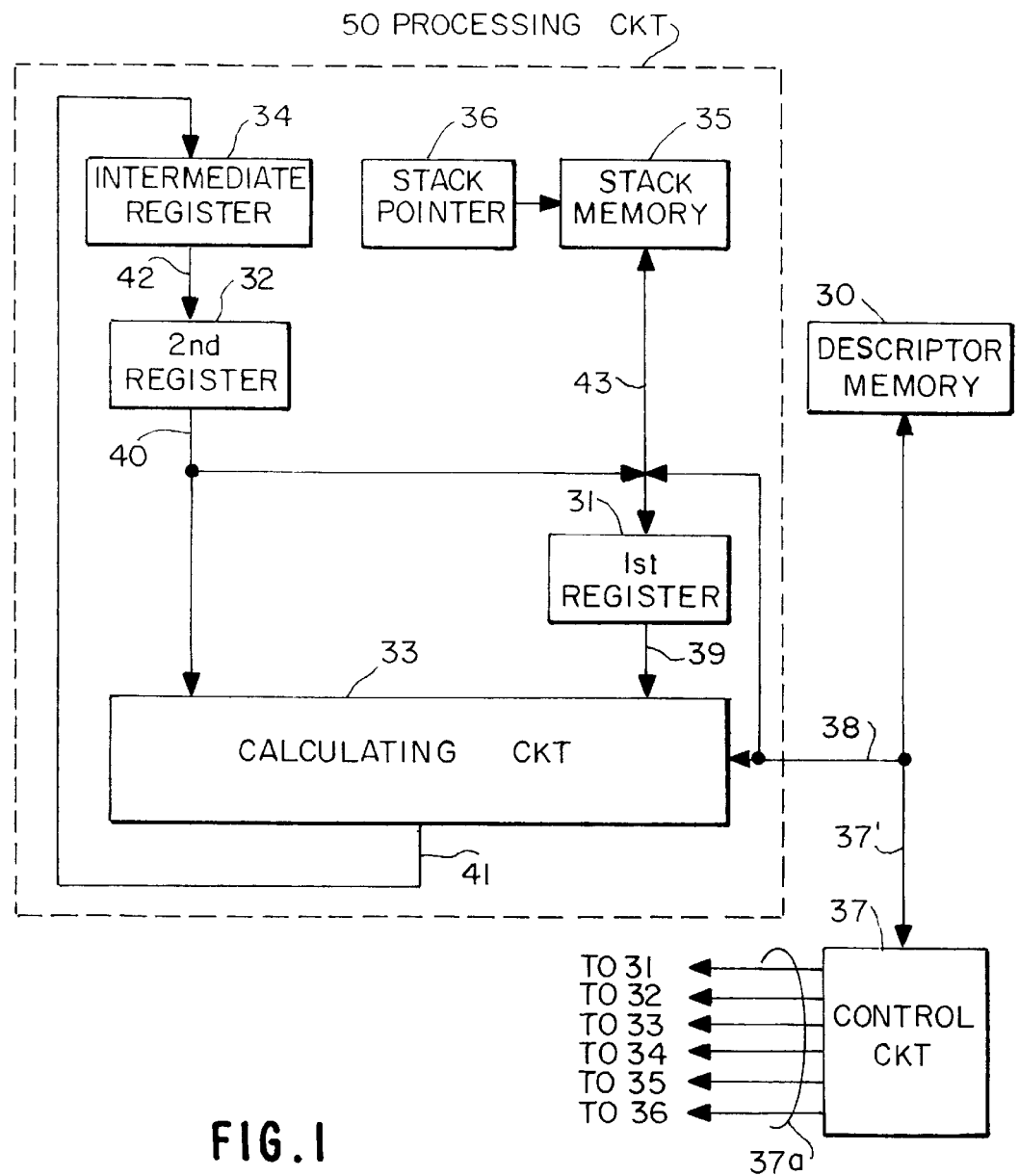
FIG. 1 is a block diagram of a logic simulator according to a first embodiment of this invention.

Referring to FIG. 1, a logic simulator according to a first embodiment of this invention comprises a descriptor memory 30 which memorizes descriptors descriptive of a simulation model of a logic circuit as memorized descriptors. The descriptors are typically variables. More specifically, the descriptor memory 30 memorizes a description of the simulation model. The description is composed of the descriptors, functional operators, simulation initial values, and the like. The functional operators are, for example, AND, OR, NOT operators and combinations of the descriptors. The simulation initial values are, for example, initial values for registers and memories. The registers and memories are included in the logic simulator and will become clear as the description proceeds.

Connected to the descriptor memory 30, a first register 31 memorizes each of the memorized descriptors as a first datum. A second register 32 memorizes a second datum which will presently become clear.

Connected to the first and the second registers 31 and 32, a calculating circuit 33 carries out calculation on the first and the second data in compliance with one of the functional operators that joins the first and the second data in question and is delivered from the descriptor memory 30. The calculation circuit 33 thereby produces a result of calculation.

Connected to the calculating circuit 33, an intermediate register 34 memorizes the result of calculation as an intermediate datum. Produced from the intermediate register 34, the intermediate datum is memorized in the second register 32 afresh as the second datum. Thus, the intermediate register 34 serves as a refreshing unit connected to the second register 32 and the calculating circuit 33. The refreshing unit carries out refreshment of the second datum by the result of calculation.

A stack memory 35 is connected to the descriptor memory 30 and the second register 32. The stack memory 35 has memory regions assigned with memory addresses and memorizes the result of calculation and the second datum which are supplied from the second register 32 in particular ones of the memory regions. Connected to the stack memory 35, a stack pointer 36 successively gives the stack memory 35 particular ones of the memory addresses that specifies the particular ones of the memory regions.

A control circuit 37 is connected to the descriptor memory 30, the first and the second registers 31 and 32, the calculating circuit 33, the intermediate register 34, the stack memory 35, and the stack pointer 36 through a control line 37a. The control circuit 37 controls the descriptor memory 30, the first and the second registers 31 and 32, the calculating circuit 33, the intermediate register 34, the stack memory 35, and the stack pointer 36 by the use of the control line 37a. More particularly, the control circuit 37 controls transfer of the descriptor in question and the functional operator from the descriptor memory 30 to the first register 31 and the calculating circuit 33, the calculation by the calculating circuit 33, and the refreshment of the second datum by the result of calculation through the intermediate register 34.

In FIG. 1, various signal lines are designated by reference numerals 37', 38, 39, 40, 41, 42, and 43. The signal line 37' is for making the control circuit 37 control the transfer, the calculation, and the refreshment in compliance with the descriptors memorized in the descriptor memory 30. The manner of control by the descriptors will become clear in due course. The signal line 38 is for selection of the functional operator and storage of the result of calculation in the descriptor memory 30 in the manner which will later be described. The signal line 39 is for supply of the first datum to the calculating circuit 33. The signal line 40 is for supply of the second datum to the calculating circuit 33 and to the stack memory 43. The signal lines 41 and 42 are for supply of the result of calculation to the intermediate register 34 and of the intermediate datum to the second register 32 and are used as parts of the refreshing unit.

Figure 2:
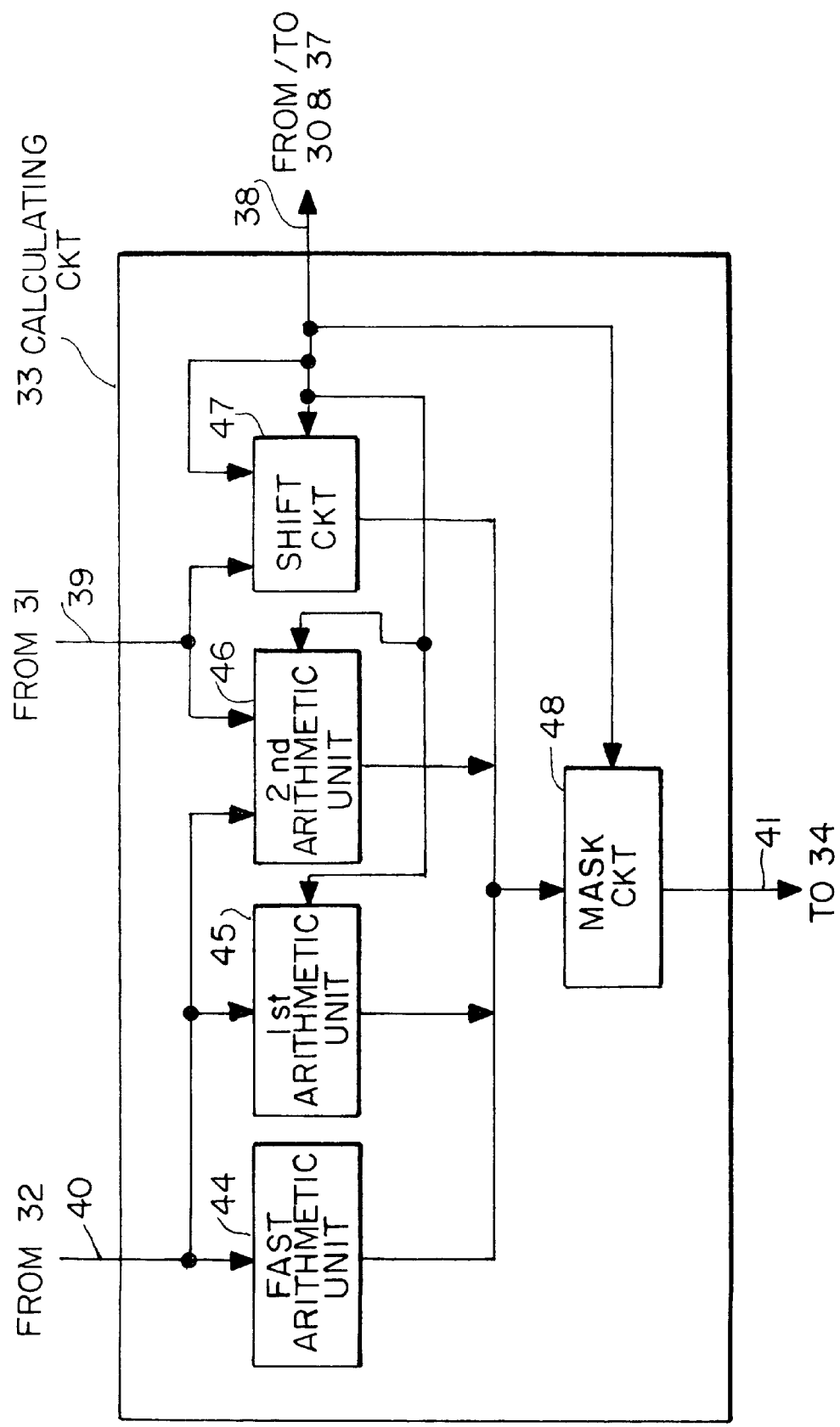
FIG. 2 is a block diagram of a calculating circuit of the logic simulator illustrated in FIG. 1.

Referring to FIG. 2, the calculating circuit 33 comprises a fast arithmetic unit 44 connected to the second register 32 for carrying out an arithmetic operation of the second datum at a high speed. A first arithmetic unit 45 is connected to the second register 32 and the descriptor memory 30 to carry out a first arithmetic operation of the second datum and the descriptor. A second arithmetic unit 46 is connected to the second register 32 and the first register 31 to carry out a second arithmetic operation of the first and the second data. A shift circuit 47 is connected to the first register 31 and the control circuit 37 to shift the first datum towards a right-hand side and a left-hand side under control of the control circuit 37. Connected to the fast arithmetic unit 44, the first and the second arithmetic units 45 and 46, and the shift circuit 47, a masking circuit 48 carries out a masking operation of a specific bit of an output signal of each of the arithmetic units 44 to 46 and the shift circuit 47. The specific bit of the output signal of each of the arithmetic units 44 to 46 and the shift circuit 47 is specified by a specifying signal produced by the control circuit 37. An output signal of the mask circuit 48 is delivered to the intermediate register 34. The arithmetic units 44 to 46 and the shift circuit 47 will become clear as the description proceeds.

Turning back to FIG. 1, description will proceed to operation of the logic simulator. It will be assumed that the logic simulator simulates a function of the simulation model that is described by a logical expression:

$$D=A*B+C, \tag{1}$$

where D, A, B. and C represent descriptors while * and + represent an AND operator and an OR operator, respectively. In order to carry out simulation of the function, the descriptor memory 30 preliminarily memorizes codes of operation in the manner which will presently be described.

In FIG. 3, the logical expression is illustrated at a left-hand side of the figure. The codes are illustrated at a right-hand side of the figure in correspondence to first through sixth steps S1, S2, S3, S4, S5, and S6 of operation and together with an actual operation carried out by each of the codes. Such codes are memorized in the descriptor memory 30 described in conjunction with FIG. 1 and are used in the manner which will be described in the following.

The code of the first step S1 is represented by GET A and is indicative of read-out of the descriptor A. The code of the second step S2 is represented by GET B and is indicative of read-out of the descriptor B. The code of the third step S3 is represented by AND and is indicative of execution of A*B. The code of the fourth step S4 is represented by GET C and indicates read-out of the descriptor C. The code of the fifth step S5 is represented by OR and indicates execution of A*B+C. The code of the sixth step S6 is represented by EXIT and indicates storage of a result of the execution of A*B+C.

In order to start the simulation of the function, the control circuit 33 (FIG. 1) successively reads the codes out of the descriptor memory 30 from the first step S1 to the sixth step S6 and controls other parts of the logic simulator of FIG. 1 in the following manner.

Figure 4:
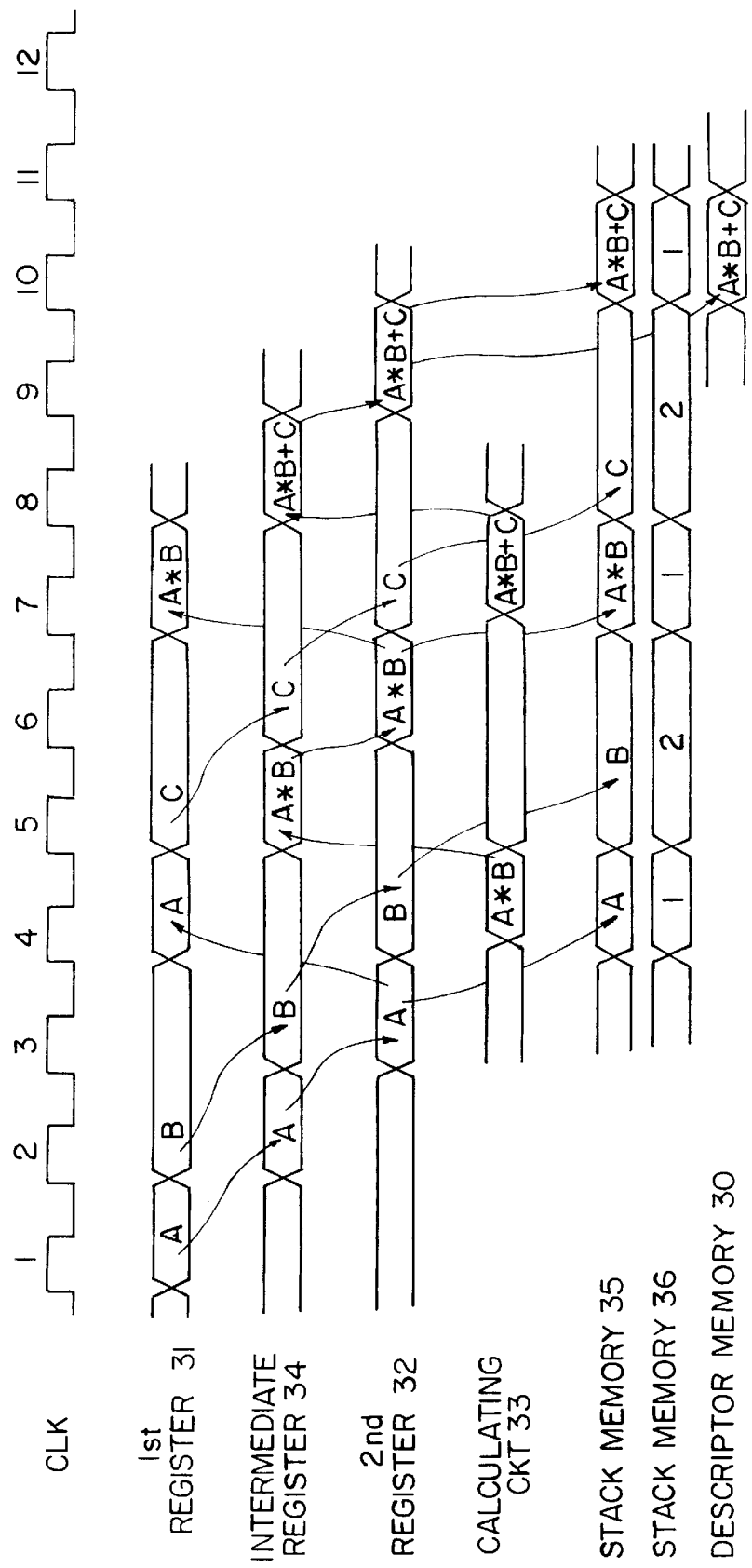
FIG. 4 is a time chart for use in describing operation of the logic simulator illustrated in FIG. 1.

Referring to FIG. 4 in addition to FIGS. 1 and 2, description will proceed to simulation operation of the logic simulator. Simulation of the function described by the logical expression D+A*B+C proceeds under control of the control circuit 37.

As a first clock cycle CLK 1, the control circuit 37 reads the descriptor or variable A and stores the descriptor A in the first register 31 as the first datum A.

At a second clock cycle CLK 2, the intermediate register 34 memorizes the first datum A through the calculating circuit 33 as the intermediate datum A. In this event, the first datum A may be stored in the intermediate register 34 with the first datum A shifted towards either the right-hand side or the left-hand side by the shift circuit 47. In the second clock cycle CLK 2, the first register 31 memorizes the descriptor or variable B as the first datum B.

At a third clock cycle CLK 3, the second register 32 memorizes the intermediate datum A as the second datum A. Simultaneously, the first datum B is transferred from the first register 31 to the intermediate register 34 to be stored in the intermediate register 34 as the intermediate datum B.

At a fourth clock cycle CLK 4, the first register 31 memorizes the second datum A as the first datum A. Simultaneously, the stack memory 35 memorizes the second datum A according to an indication of 1 by the stack pointer 36. The second register 32 memorizes the intermediate datum B as the second datum B. The calculating circuit 33 carries out calculation of A*B by the use of the second arithmetic unit 46 and produces a result of calculation.

At a fifth clock cycle CLK 5, the result of calculation is memorized in the intermediate register 34. Simultaneously, the stack memory 35 memorizes the second datum B. The first register 31 memorizes the descriptor or variable C as the first datum C. In the meantime, the stack pointer 36 indicates an increased value of 2, into which the indication 1 is increased by one.

At a sixth clock cycle CLK 6, the result of calculation is transferred from the intermediate register 34 to the second register 32. Simultaneously, the first datum C is memorized in the intermediate register 34 as the intermediate data C through the calculating circuit 33.

At a seventh clock cycle CLK 7, the result of calculation is transferred from the second register 32 to the first register 31. Simultaneously, the stack pointer 36 becomes to indicate a decreased value of 1, into which the increased value is decreased by one. Under control of the stack pointer 36, the stack memory 35 again memorizes the result of calculation. Simultaneously, the second register 32 memorizes the intermediate datum C as the second datum C. The calculating circuit 33 carries out calculation of A*B+C and produces a result of calculation of A*B+C.

At an eighth clock cycle CLK 8, the result of calculation of A*B+C is transferred from the calculating circuit 33 to the intermediate register 34. At the same time, the stack pointer 36 becomes 2 again to indicate the increased value. Under control of the stack pointer 36, the stack memory 35 memorizes the second datum C.

At a ninth clock cycle CLK 9, the result of calculation of A*B+C is transferred from the intermediate register 34 to the second register 32.

At a tenth clock cycle CLK 10, the result of calculation of A*B+C is transferred from the second register 32 to the stack memory 35 to be memorized in the stack memory 35. In this clock cycle CLK 10, the stack pointer indicates the decreased value. Simultaneously, the result of calculation of A*B+C is also transferred to the description memory 30 to be memorized in the description memory 30. As a result, the simulation operation comes to an end for the function described by the logical expression (1).

Turning to FIG. 5, other codes of operation are illustrated to be used in simulating another function of the simulation model that is described by another logical expression:

$$H=A*B+C*D+E*F+G, \qquad (2)$$

where H, E, F, and G represent descriptors. These codes are illustrated in correspondence to first through fourteenth steps S1 to S14 of operation and together with an actual operation carried out by each of the codes. Although similarly named, the first through the sixth steps S1 to S6 may not be identical with those described in connection with FIG. 3.

When the logic simulator illustrated in FIG. 1 simulates the other function, the codes are preliminarily memorized in the descriptor memory 30 (FIG. 1). The control circuit 33 (FIG. 1) successively reads the codes out of the descriptor memory 30 from the first step S1 to the fourteenth step S14 and controls other parts of the logic simulator in the manner similar to the simulation of the function described by the logical expression (1).

Figures 6, 7:
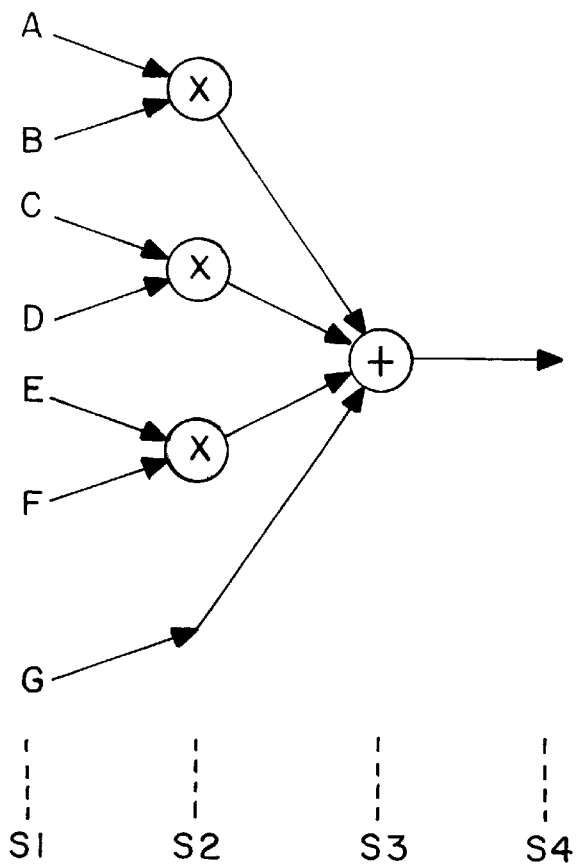
FIG. 6 is still another diagram for use in describing operation of the logic simulator illustrated in FIG. 1.
FIG. 7 is yet another diagram for use in describing operation of the logic simulator illustrated in FIG. 1.

Turning to FIG. 6, illustration is made of different codes of operation for use in simulating, by the use of the fast arithmetic unit 44 (FIG. 2) of the calculating circuit 33 (FIG. 2), the function of the simulation model that is described by the logical expression (2). The different codes are illustrated in correspondence to first through fourth steps S1, S2, S3, and S4 of operation and together with an actual operation carried out by each of the different codes. It is to be noted here that a code of the second step S2 is represented by FAU and is indicative of execution of A*B, C*D, E*F, and G by the use of the fast arithmetic unit 44. Likewise, a code of the third step S3 is also represented by FAU and is indicative of execution of A*B+C*D+E*F+G by the use of the fast arithmetic unit 44. The different codes are preliminarily memorized in the descriptor memory 30 (FIG. 1) before starting simulation of the function which is described by the logical expression (2). On starting the simulation of the function described by the logical expression (2), the control circuit 37 (FIG. 1) successively reads the different codes out of the descriptor memory 30 from the first step S1 to the fourth step S4 and controls other parts of the logic simulator of FIG. 1 in the manner which will presently be described.

In FIG. 7, illustration is made of an example of execution which is carried out by the fast arithmetic unit 44. Referring again to FIG. 6 in addition to FIGS. 1, 2, and 7, simulation of the function described by the logical expression (2) proceeds under control of the control circuit 37. Variables A, B, C, D, E, F, and G are read out of the descriptor memory 30 and transferred to the second register 32 through the first register 31, the calculating circuit 33, and the intermediate register 34 to be memorized in the second register 32 as memorized variables A, B, C, D, E, F, and G.

Responsive to the memorized variables A, B, C, D E, F, and G, the fast arithmetic unit 44 of the calculating circuit 33 simultaneously carries out calculations of A*B, C*D, and E*F to transfer results of the calculations to the second register 32 through the intermediate register 34. In this event, the fast arithmetic unit 44 receives the variable G and delivers the variable G as it is to the second register 32 through the intermediate register 34.

Responsive to the results of the calculations and to the variable G, the fast arithmetic unit 44 calculates a calculation of A*B+C*D+E*F+G to produce a result of the calculation of A*B+C*D+E*F+G. The result of the calculation of A*B+C*D+E*F+G is transferred to the descriptor memory 30 through the intermediate and the second registers 34 and 32 and the signal lines 40 and 38 to be memorized in the descriptor memory 30. As a result, simulation operation comes to an end for the function described by the logical expression (2).

Use of the fast arithmetic unit 44 and of the codes of FIG. 6 makes it possible to rapidly complete the simulation operation in comparison with a case where the codes of FIG. 5 are used in the simulation operation. This is because the number of the steps of the codes illustrated in FIG. 6 is considerably less than that of the steps illustrated in FIG. 5.

Summarizing the illustration with reference to FIG. 1, the control circuit 37 specifies successive steps of operation to control, at each of the steps, transfer of each descriptor and the functional operator from the descriptor memory 30 to the first register 31 and to the calculating circuit 33, calculation by the calculating circuit 33, and the refreshment of the second datum by the result of calculation that is produced by the calculating circuit 33. The first and the second registers 31 and 32 memorize previous data as the first and the second data before refreshment at a previous one of the steps and current data as the first and the second data after refreshment at a current one of the steps. The current one of the steps immediately follows the previous step in the successive steps.

In FIG. 1, a combination of the first and the second registers 31 and 32, the calculating circuit 33, intermediate register 34, the stack memory 35, and the stack pointer 36 will be called a processing circuit 50 for convenience of description. Connected to the descriptor memory 30 and the control circuit 37, the processing circuit 50 carries out, under control of the control circuit 37, processing of the descriptors or variables which are memorized in the descriptor memory 30.

Figure 8:
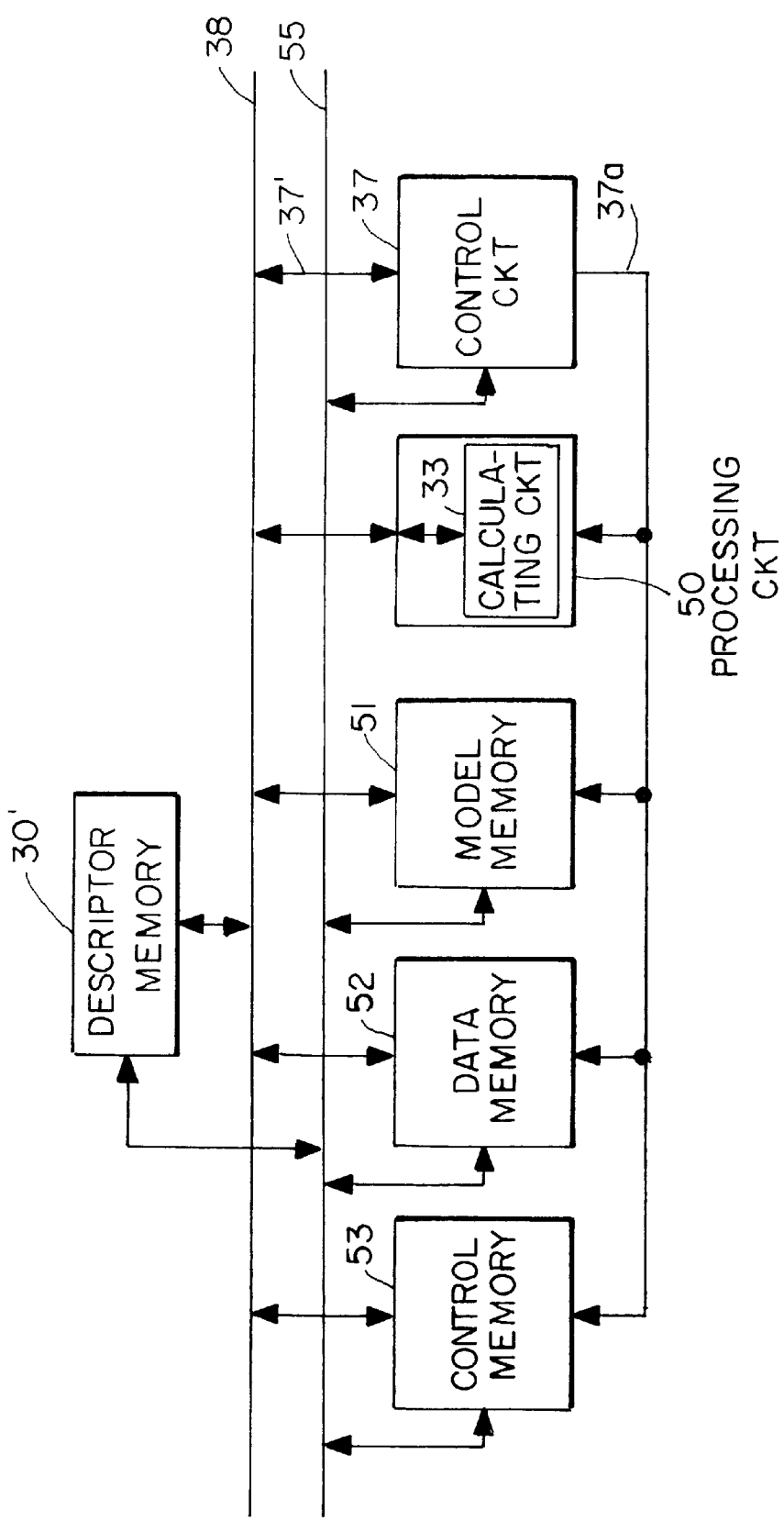
FIG. 8 is a block diagram of a logic simulator according to a second embodiment of this invention.

Referring to FIG. 8, a logic simulator according to a second embodiment of this invention comprises similar parts designated by like reference numerals. Like the logic simulator illustrated in FIG. 1, the logic simulator illustrated in FIG. 8 comprises the control circuit 37 and the processing circuit 50 which comprises the calculating circuit 33, the first, the second, and the intermediate registers 31 (FIG. 1), 32 (FIG. 1), and 34 (FIG. 1) and the stack memory 35 (FIG. 1).

The logic simulator illustrated in FIG. 8 further comprises another descriptor memory 30' for memorizing the descriptors or variables as memorized descriptors. In the illustrated example, the descriptor memory 30' memorizes input values for variables as the memorized descriptors. The descriptor memory 30' is furthermore for memorizing a simulation result which will later become clear.

A model memory 51 memorizes a plurality of simulation models which should be simulated one at a time and are described by memory operators. More specifically, each of the simulation models is described in a form of a sequence of instruction codes which is equivalent to the codes illustrated in, for example, FIG. 3.

A data memory 52 memorizes the previous data as memorized data at the current step. More specifically, the data memory 52 memorizes various previous data which are previously memorized in the first, the second, and the intermediate registers 31, 32, and 34 and the stack memory 35.

A control memory 53 memorizes control information. The control information is, for example, each of routines of a control program which is for use in controlling operation of the descriptor memory 30', the model memory 51, the data memory 52, and the processing circuit 50.

The calculating circuit 33 of the processing circuit 50 is connected to the model memory 51 through the signal line 38 to carry out the calculation on the current data with one of the memory operators used as the functional operator.

The control circuit 37 is connected to the model memory 51, the control memory 53, and the data memory 52 through the signal line 38 and a control line 37a. The control circuit 37 reads the control information out of the control memory 51 with reference to one of the simulation models. By the use of the control line 37a, the control circuit 37 controls operation of the processing circuit 50 with reference to the input values and the memorized data memorized in the data memory 52. That is, the control circuit 37 controls transfer of each of the memorized descriptors from the descriptor memory 30' to the first register 31, transfer of the above-mentioned one of the memory operators from the model memory 51 to the calculating circuit 33, the calculation on the current data by the calculating circuit 33, and the refreshment of the second datum by the result of calculation produced by the calculating circuit 33.

In the illustrated example, the signal line 38 forms a data bus. Each of the control circuit 37, descriptor memory 30', the model memory 51, the data memory 52, and the control memory 53 is connected to an address bus 55 which is used in transmission of addresses which will become clear as the description proceeds.

Figure 9:
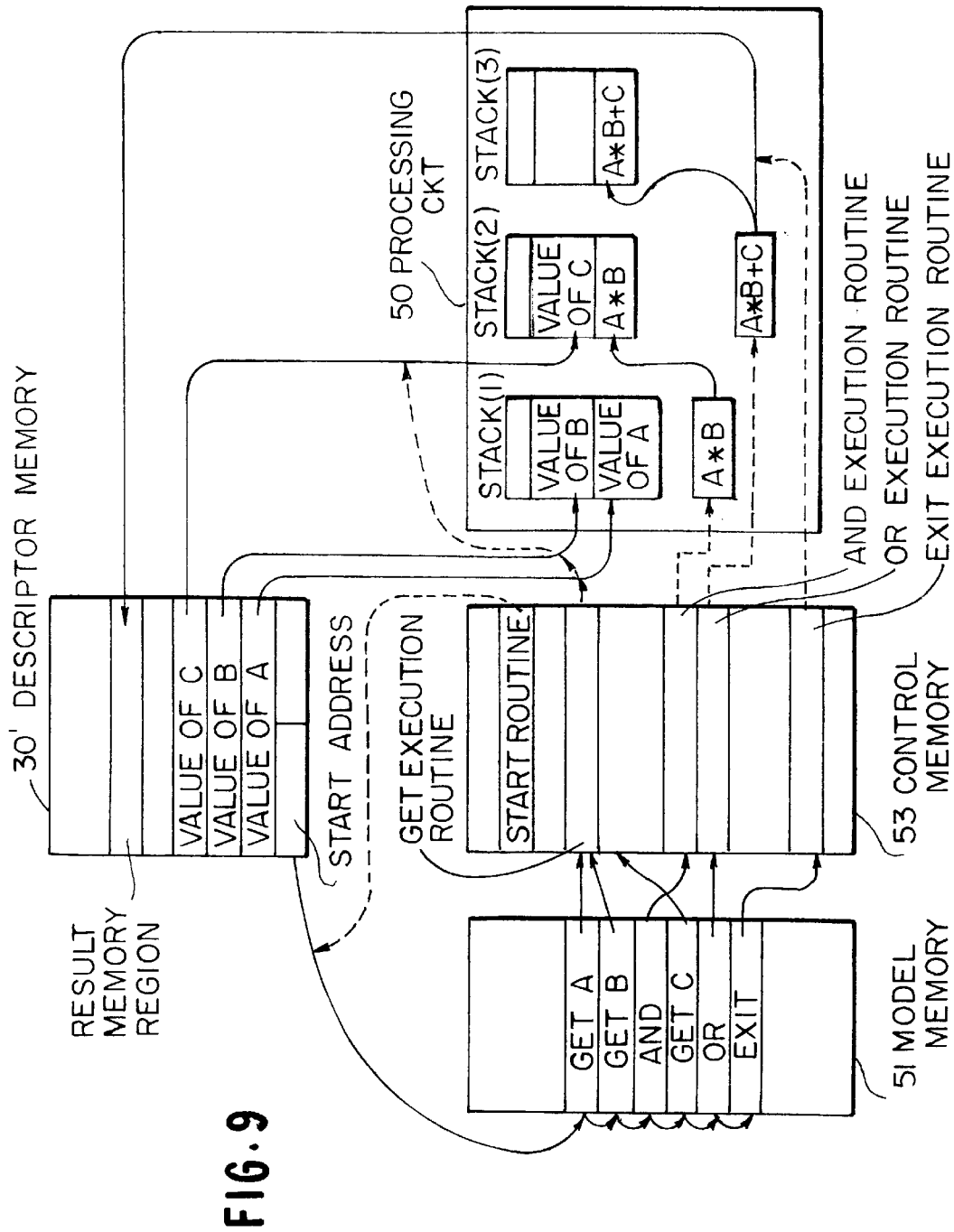
FIG. 9 is a block diagram for use in describing operation of the logic simulator illustrated in FIG. 8.

Referring to FIG. 9, description will proceed to operation of the logic simulator illustrated in FIG. 8. It will be assumed that the logic simulator simulates a simulation model described by the logical expression (1). In this case, simulation operation is carried out without using the data memory 52. The model memory 51 memorizes a sequence of codes illustrated in FIG. 3. For example, the code GET A is memorized in a specific memory region of the model memory 51 that is assigned with a specific memory address of the model memory 51. The control circuit 37 is not illustrated in FIG. 9.

The descriptor memory 30' memorizes values of variables or descriptors A, B, and C and a start address indicative of the specific memory address of the model memory 51. The control memory 53 memorizes various routines of the control program as the control information.

The operation of the logic simulator is carried out as follows.

(1) When the control circuit 37 receives an execution command, the control circuit 37 refers to a start routine and reads the start address out of the descriptor memory 30' as a read-out address on the basis of the start routine.

(2) Responsive to the read-out address, the control circuit 37 reads the code GET A out of the memory 51.

(3) Subsequently, the control circuit 37 reads from the control memory 53 a GET execution routine and executes operation of the code GET A in accordance with the GET execution routine.

(4) When supplied with the GET execution routine, the control circuit 37 stores the value A in the stack memory 35 (FIG. 1) of the processing circuit 50. The stack memory 35 is depicted in FIG. 9 at three areas as STACK (1), STACK (2), and STACK (3) for convenience of description. At first, the value A alone is stored in the stack memory designated by STACK (1).

(5) Subsequently, the control circuit 37 reads from the model memory 51 the code GET B which follows he code GET A. Like in the code GET A, the control circuit 37 stores the value B of the descriptor memory 30' in the stack memory designated by STACK (1).

(6) The control circuit 37 reads from the memory 51 the code AND which follows the code GET B. Responsive to the code AND, the control circuit 37 reads an AND execution routine out of the control memory 53 and makes the calculating circuit 33 of the processing circuit 50 carry out calculation of A*B on the basis of the AND execution routine. A result of calculation of A*B is memorized in the stack memory designated by STACK (2).

(7) Subsequently, the control circuit 37 reads from the model memory 51 the code GET C which follows the code AND. Like in the code GET A, the control circuit 37 stores the value C of the descriptor memory 30' in the stack memory designated by STACK (2).

(8) The control circuit 37 reads from the memory 51 the code OR which follows the code AND. Responsive to the code OR, the control circuit 37 reads an OR execution routine out of the control memory 53 and makes the calculating circuit 33 of the processing circuit 50 carry out calculation of A*B+C on the basis of the OR execution routine. A result of calculation of A*B+C is memorized in the stack memory designated by STACK (3).

(9) The control circuit 37 reads from the memory 51 the code EXIT which follows the code OR. Responsive to the code EXIT, the control circuit 37 reads an EXIT execution routine out of the control memory 53 and stores the result of calculation of A*B+C in a result memory region of the descriptor memory 30' as the simulation result.

The processing circuit 50 operates in the manner described in conjunction with FIG. 4. Consequently, the operation of the logical simulator comes to an end for the simulation model described by the logical expression (1).

Figure 10:
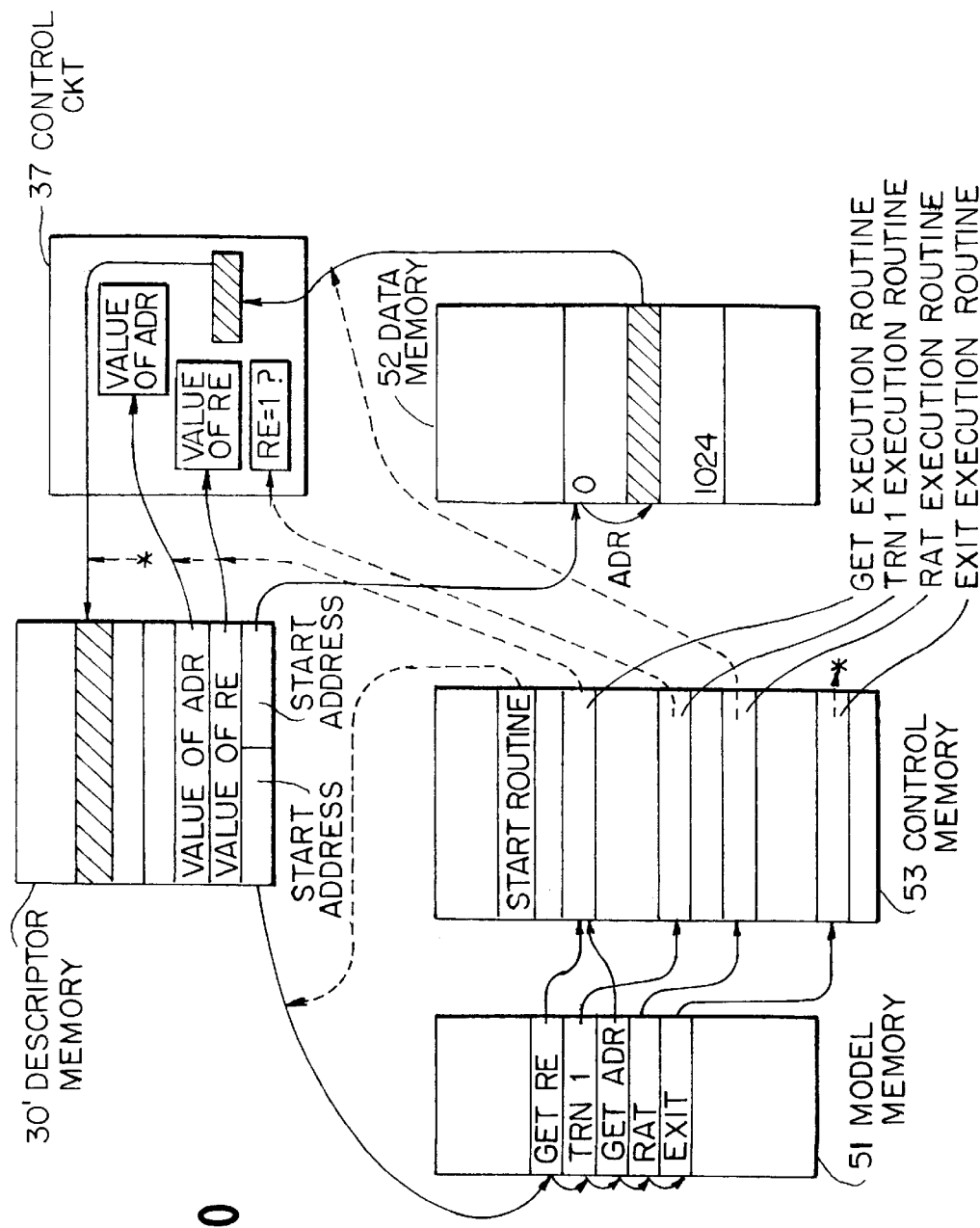
FIG. 10 is a block diagram for use in describing operation of the logic simulator illustrated in FIG. 8.
Figures 11, 12:
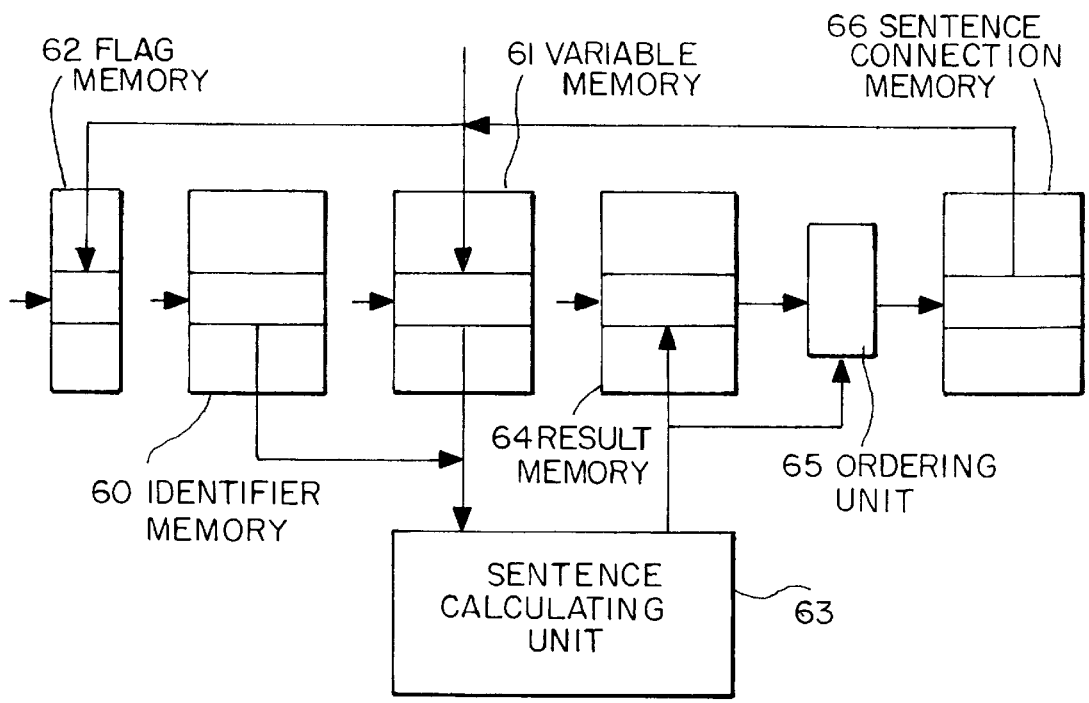
FIG. 11 is a diagram for use in describing operation of the logic simulator illustrated in FIG. 8.
FIG. 12 is a block diagram of a logic simulator according to a third embodiment of this invention.

Referring to FIGS. 10 and 11, description will proceed to another operation of the logic simulator illustrated in FIG. 8. It will be assumed that the logic simulator simulates another simulation model which is illustrated in FIG. 11 along a top line and is described by a functional description:

MEM M (0=1024, 0=16)=IF RE THEN READ AT ADR. (3)

In this case, simulation operation is carried out by the use of the data memory 52. The model memory 51 memorizes a sequence of codes illustrated in FIG. 11 along second through sixth lines from the top.

In FIG. 11, the codes are illustrated in correspondence to first through fifth steps S1, S2, S3, S4, and S5 and together actual operation carried by each of the codes. The code of the first step S1 is represented by GET RE and is indicative of read-out of a value of RE which should be used in the functional description (3). The code of the second step S2 is represented by TRN1 and indicates that, when the value of RE is "1", operation proceeds to the third step S3 and that, otherwise, operation proceeds to the fifth step S5. The code of the third step S3 is represented by GET ADR and is indicative of read-out of a value of address ADR used in the functional description (3). The code of the fourth step S4 is represented by RAT and is indicative of read-out of data at the address ADR. The code of fifth step S5 is represented by EXIT and is indicative of storage of a result.

That is, the functional description is an instruction for use in reading, when the value of RE is equal to "1", special data of one word out of a special memory region of the data memory 52 that is specified by a special memory address indicated by the address ADR. The special data of one word has a sixteen-bit length.

In FIG. 10, it will be assumed that the code GET RE is memorized in a specific memory region of the model memory 51 that has a specific memory address of the model memory 51. The descriptor memory 30' preliminarily memorizes the value of RE, the value of the address ADR, and a start address indicative of the specific memory address of the model memory 51. Furthermore, the descriptor memory 30' preliminarily memorizes another start address indicative of, for example, zeroth address of the data memory 52. The control memory 53 memorizes various routines of the control program.

In FIGS. 10 and 11, the simulator carries out the simulation operation as follows.

(1) At the first step S1, the control circuit 37 executes a GET execution routine and reads the value of RE out of the descriptor memory 30' to store the value of RE in a register included in the control circuit 37.

(2) At the second step S2, the control circuit 37 reads the code TRN1 out of the model memory 51 and executes a TRN1 execution routine to check whether or not the value of RE is equal to "1". When the value of RE is equal to "1", operation proceeds to the third step S3. Otherwise, operation proceeds to the fifth step S5.

(3) At the third step S3, the control circuit 37 executes a GET execution routine and reads the value of the address ADR out of the descriptor memory 30' to store the value of the address ADR in another register included in the control circuit 37.

(4) At the fourth step S4, the control circuit 37 executes an RAT execution routine to read the special data of one word out of the special memory region of the data memory 52 that is specified by the special memory address given by adding the address ADR and the above-mentioned start address indicative of zero. The special data is memorized in a special register included in the control circuit 37.

(5) At the fifth step S5, the control circuit 37 executes an EXIT execution routine to transfer the special data from the control circuit 37 to the descriptor memory 30'. When the value of RE is not equal to "1", a content of the special register is transferred to the descriptor memory 30' with the content of the special register updated by the special data. As a result, the simulation operation comes to an end for the functional description.

Turning to FIG. 12, a logic simulator according to a third embodiment of this invention is for simulating a logic circuit in compliance with a plurality of sentences. Each sentence is identified by an identifier and expressed by a combination of at least two variables. The sentence is, for example, the logical expression (1) or the functional description (3).

The logic simulator comprises an identifier memory 60 which memorizes the identifier of a current sentence of the sentences as a memorized identifier. Connected to the identifier memory 60, a variable memory 61 memorizes, as memorized values, current values of the variables of the current sentence.

A flag memory 62 memorizes a flag indicative of whether or not the current values are changed while simulation is in progress in compliance with each of the sentences.

A sentence calculating unit 63 is connected to the identifier memory 60, the variable memory 61, and the flag memory 62. The sentence calculating unit 63 calculates a calculated result value in compliance with the current sentence and by using the memorized values when the flag indicates a change in at least one of the current values during progress of simulation in compliance with a previous one of the sentences. The previous sentence is used in simulating the logic circuit immediately before the current sentence.

A result memory 64 is connected to the sentence calculating unit 63. The result memory 64 memorizes an initial result value which the current sentence has when calculated by using initial values of the current values.

An ordering unit 65 is connected to the sentence calculating unit 63 and the result memory 64. The ordering unit 65 gives an order to the calculated result value in a predetermined manner when the calculated result value differs from the initial result value.

Connected to the ordering unit 65, a sentence connection memory 66 is for memorizing sentence connection information between the current sentence and a following one of the sentences. The following sentence should be used in simulating the logic circuit immediately after the current sentence.

Figure 13:
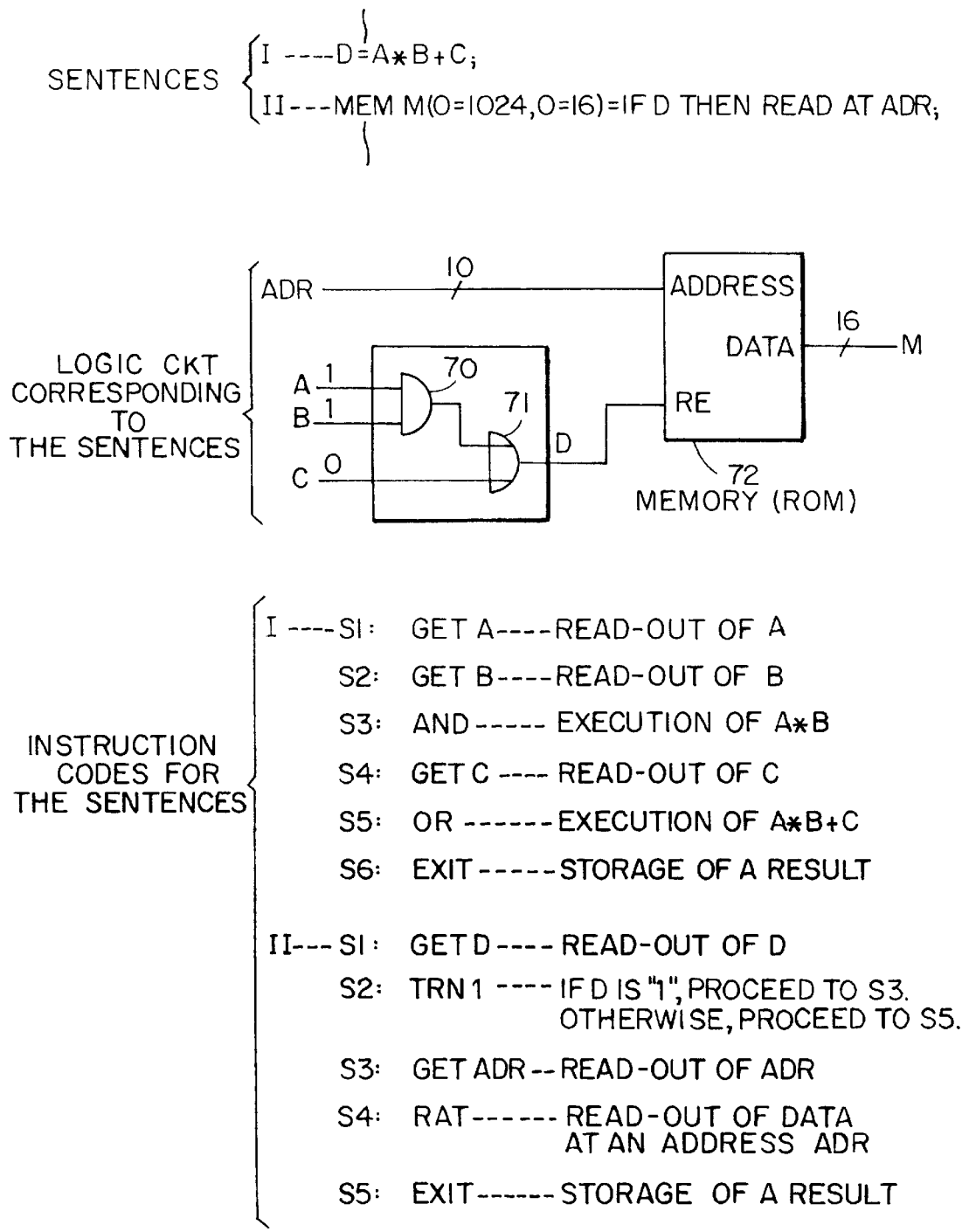
FIG. 13 is a diagram for use in describing operation of the logic simulator illustrated in FIG. 12.

Turning to FIG. 13, sentences I and II are illustrated at the top part of the figure. The sentences I and II are two consecutive sentences of a succession which should be simulated by the simulator illustrated in FIG. 12. The sentences I and II are equivalent to the logical expression (1) and the functional description (3). The sentence II is expressed by the use of the variable D instead of the variable RE of the functional description (3).

A logic circuit corresponding to the sentences I and II is illustrated at the middle part of the figure. The logic circuit comprises an AND circuit 70, an OR circuit 71, and a read-only memory (ROM) 72.

At the bottom of the figure, instruction codes are illustrated for the sentences I and II. The codes for the sentence I are equivalent to the codes which are illustrated in FIG. 3 for the logical expression (1). The codes for the sentence II are similar to the codes which are illustrated in FIG. 11 for the functional description (3). In the codes for the sentence II, the variable D is used instead of the variable RE.

Figure 14:
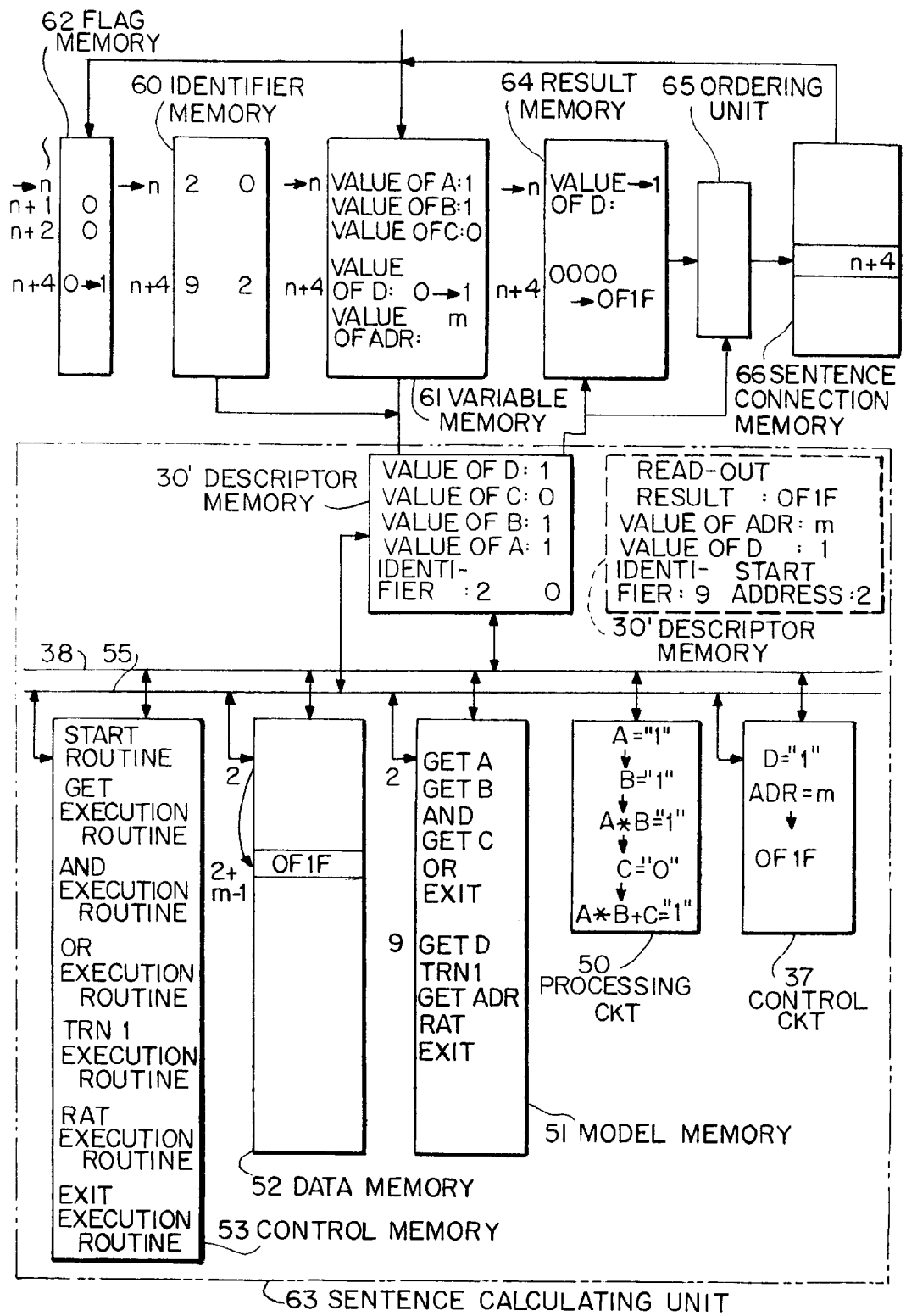
FIG. 14 is a block diagram for use in describing operation of the logic simulator illustrated in FIG. 12.

Referring to FIG. 14, a description of the operation of the logic simulator illustrated in FIG. 12. It will be assumed that the logic simulator simulates the logic circuit in compliance with the sentences I and II. It should be noted here in connection with FIG. 14 that the sentence calculating unit 63 has a structure similar to the logic simulator illustrated in FIG. 8 except that the descriptor memory 30' is connected to the identifier memory 60, the variable memory 61, and the result memory 64.

It will also be assumed that, before simulation is started for the logic circuit, the memories, such as 60 through 62, 64, 66, 51, and 53, of the logic simulator of FIG. 14 are preliminarily supplied with various data which are necessary for the simulation of the logic circuit. The various data are as follows. The illustrated variable memory 61 already memorizes values "1", "1", "0", "0", and "m" for the variables A, B, C, D, and ADR at addresses n, n+1, n+2, n+4, and n+5 thereof. The identifier memory 60 preliminarily memorizes identifiers for the sentences I and II. That is, the illustrated identifier memory 60 memorizes the identifier "2, 0" for the sentence I at its address n and the identifier "9, 2" for the sentence II at its address n+4. The flag memory 62 preliminarily memorizes a flag of "1" at its address n to indicate a change of the values of the sentence I. Furthermore, the flag memory 62 initially memorizes a flag of "0" at its address n+4 to indicate that such a change is not introduced to the sentence II. The result memory 64 memorizes an initial result value "0" as the variable D of the sentence I at its address n and another initial result value "0000" (a hexadecimal notation) as an output value of the sentence II at its address n+4. The sentence connection memory 66 memorizes a value n+4 for the sentence connection information between the sentences I and II.

In the sentence calculating unit 63, the model memory 51 memorizes the codes for the sentences I and II that are illustrated at the bottom part of FIG. 13. In this respect, the model memory 51 of FIG. 14 is similar to the model memories 51 described in conjunction with FIGS. 9 and 10. For example, the code GET A for the sentence I is memorized in a first specific memory region of the model memory 51 that is assigned with a first specific memory address of the model memory 51. In the illustrated example, the first specific memory address is equal to 2. The code GET D for the sentence II is memorized in a second specific memory region of the model memory 51 that has a second specific memory address of the model memory 51. In the illustrated example, the second specific memory address is equal to 9. The control memory 53 preliminarily memorizes various execution routines similar to the execution routines described in conjunction with FIGS. 9 and 10.

The operation of the logic simulator is carried out as follows.

(1) A simulation controller (not shown) reads, as a read-out identifier, the identifier "2, 0" out of a memory region of the address n of the identifier memory 60 and delivers the read-out identifier "2, 0" to the descriptor memory 30' (depicted by a solid-line rectangle). Simultaneously, the simulation controller reads, as a read-out flag, the flag "1" out of a memory region of address n of the flag memory 62 to check whether or not the read-out flag indicates "1". Furthermore, the simulation controller successively reads the values "1", "1", and "0" of the variables A, B, and C out of memory regions of the addresses n, n+1, and n+2 to deliver the values of the variables A, B, and C to the descriptor memory 30'.

As a result, the descriptor memory 30' memorizes the identifier "2, 0" and the values of the variables A, B, and C of the sentence I while operation proceeds from the address n to the address n+2 of the variable memory 61. An upper bit "2" of the identifier "2, 0" indicates the first specific memory address of the model memory 51 as a first start address of the codes for the sentence I.

(2) Inasmuch as the read-out flag indicates "1", the simulation controller judges that the values of the variables of the sentence I are changed. The simulation controller supplies an execution command to the sentence calculating unit 63 to make the sentence calculating unit 63 calculate a result value in compliance with the sentence I and by using the values of the variables of the sentence I. Operation of the sentence calculating unit 63 is carried out as follows.

When the control circuit 37 of the sentence calculating unit 63 receives the execution command, the control circuit 37 refers to a start routine and reads the first start address out of the descriptor memory 30' as a read-out address on the basis of the start routine. The first start address is represented by the upper bit of the identifier "2, 0" as mentioned above.

After the first start address is read out of the descriptor memory 30', operation of the sentence calculating unit 63 is carried out in the manner described with reference to FIG. 9. As a result, calculation of A*B+C comes to an end with a calculated result value "1" stored in the descriptor memory 30' (the solid-line rectangle) as the value of the variable D.

(3) The simulation controller stores the calculated result value "1" in the result memory 64 as the value D and compares the calculated result value "1" with the initial result value "0". Inasmuch as the calculated result value "1" differs from the initial result value "0" in this case, it is necessary to inform the flag memory 62 and the variable memory 61 that a change occurs in the calculated result value calculated as the value D. Supposing that the calculated result value has a plurality of bits and that at least two of the bits are changed as changed bits, the ordering unit 65 gives an order to the changed bits in a predetermined manner to produce the changed bits in a given order. For example, the changed bits are successively outputted from an LSB (least significant bit) side of the calculated result value towards an MSB (most significant bit) side of the calculated result value to form a change informing signal.

(4) As mentioned above, the sentence connection memory 66 memorizes the sentence connection information n+4. The sentence connection information indicates a destination address at which the calculated result value "1" of the value D should be memorized in the variable memory 61.

(5) The simulation controller stores the calculated result value "1" in the address n+4 of the variable memory 61 instead of the value "0" as the value D. Responsive to the change informing signal, the simulation controller stores the flag of "1" in the address n+4 of the flag memory 62 instead of the flag of "0" to indicate the change.

Thus, simulation operation comes to an end for the sentence I.

In FIG. 14, simulation operation is subsequently carried out for the sentence II as follows.

(1) The simulation controller reads, as the read-out identifier, the identifier "9, 2" out of a memory region of the address n+4 of the identifier memory 60 and deliver the read-out identifier "9, 2" to the descriptor memory 30' (depicted by a dashed-line rectangle). Simultaneously, the simulation controller reads, as the read-out flag, the flag "1" out of a memory region of address n+4 of the flag memory 62 to check whether or not the read-out flag indicates "1". Furthermore, the simulation controller successively reads the value "1" of the variable D and a value "m" of the variable ADR out of memory regions of the addresses n+4 and n+5 to deliver the values "1" and "m" of the variables D and ADR to the descriptor memory 30'.

As a result, the descriptor memory 30' memorizes the identifier "9, 2" and the values "1" and "m" of the variables D and ADR of the sentence II while operation proceeds from the address n+4 to the address n+5 of the variable memory 61. An upper byte "9" of the identifier "9, 2" indicates the second specific memory address of the model memory 51 as a second start address of the codes for the sentence II. A lower byte of "2" of the identifier "9, 2" indicates a start address of the data memory 52.

The sentence II describes an instruction for use in reading, when the value D is equal to "1", special data "0F1F" (hexadecimal) of one word out of a special memory region of the data memory 52 that is specified by a special memory address 2+m−1 decided by the start address "2" and an address "m" indicated by ADR. The special data of one word has a sixteen-bit length.

(2) Inasmuch as the read-out flag indicates "1", the simulation controller judges that the values of the variables of the sentence II are changed. The simulation controller supplies another execution command to the sentence calculating unit 63 to make the sentence calculating unit 63 produce a read-out result in compliance with the sentence II and by using the values of the variables of the sentence II. Operation of the sentence calculating unit 63 is carried out as follows.

When the control circuit 37 of the sentence calculating unit 63 receives the execution command, the control circuit 37 reads the second start address "9" out of the descriptor memory 30' as the read-out address. The second start address is represented by the upper bit of the identifier "9, 2" as mentioned above.

After the second start address "9" is read out of the descriptor memory 30', operation of the sentence calculating unit 63 is carried out in the manner described with reference to FIG. 10. That is, the control circuit 37 takes in the value "1" of the variable D from the descriptor memory 30' and executes the TRNl execution routine to check whether or not the value D is equal to "1". Inasmuch as the value D is equal to "1" in this case, the control circuit 37 takes in the address "m" of ADR from the descriptor memory 30'. Subsequently, the control circuit 37 takes in the special data "0F1F" from the special memory region of the data memory 52 that is specified by the special memory address 2+m−1 decided by the start address "2" and the address "m" indicated by ADR. The special data "0F1F" is memorized in the descriptor memory 30' as a read-out result.

(3) The simulation controller stores the special data "0F1F" in the address n+4 of the result memory 64 instead of the initial result value "0000".

Thus, simulation operation comes to an end for the sentence II.

Figure 15:
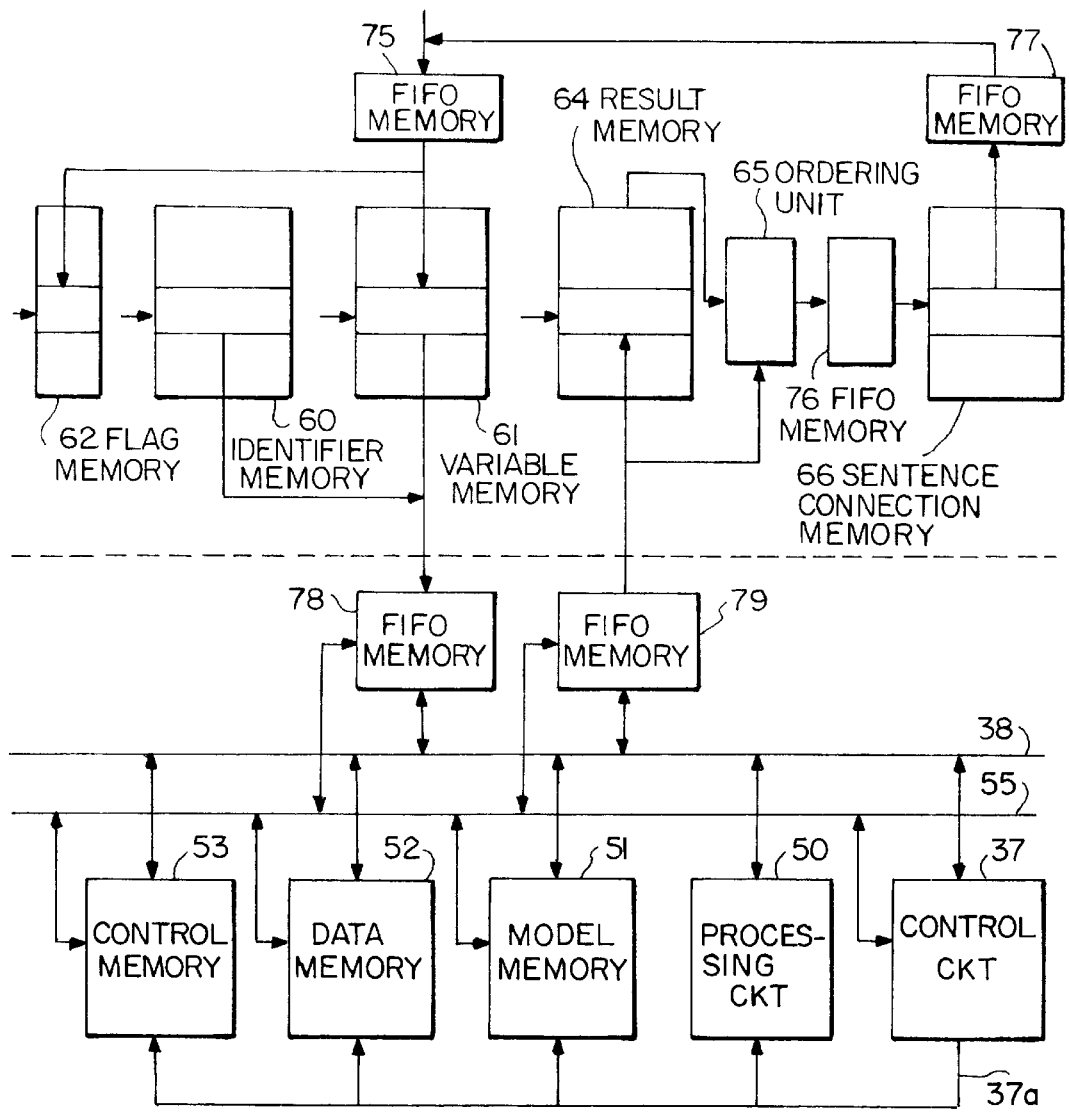
FIG. 15 is a block diagram of a logic simulator according to a fourth embodiment of this invention.

Turning to FIG. 15, a logic simulator according to a fourth embodiment of this invention is similar to that of FIG. 12 except that the logic simulator illustrated in FIG. 15 further comprises FIFO (first-in first-out) memories 75, 76, and 77 and that the sentence calculating unit 63 illustrated in FIG. 15 comprises FIFO memories 78 and 79 instead of the descriptor memory 30'.

The FIFO memory 75 has an input terminal and an output terminal which is connected to the variable memory 61 and to the flag memory 62. The FIFO memory 76 is connected between the ordering unit 65 and the sentence connection memory 66. The FIFO memory 77 has input and output terminals which are connected to the sentence connection memory 66 and the input terminal of the FIFO memory 75.

The FIFO memory 78 is connected to the variable memory 61, the identifier memory 60, the signal line or data bus 38, and the address bus 55. The FIFO memory 79 is connected to the data bus 38, the address bus 55, the result memory 64, and the ordering unit 65.

Figure 16:
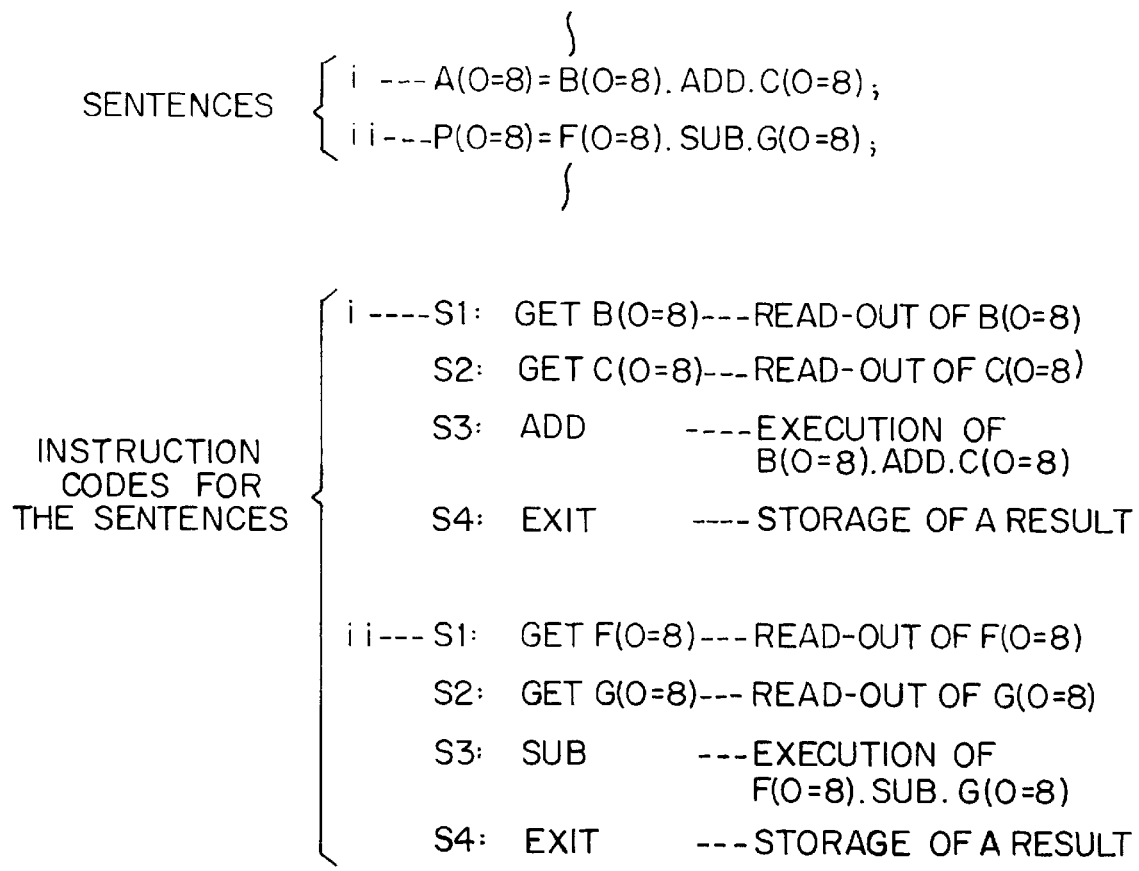
FIG. 16 is a diagram for use in describing operation of the logic simulator illustrated in FIG. 15.

Turning to FIG. 16, sentences i and ii are illustrated at the top part of the figure. The sentences i and ii are two consecutive ones of sentences of a sequence which should be simulated by the logic simulator illustrated in FIG. 15.

The sentence i is descriptive of an adding circuit which is for adding variables B and C together to produce a variable A as an addition result. Each of the variables A, B, and C has zeroth through eighth bits indicated by a symbol (0=8).

The sentence ii is descriptive of a subtracting circuit which is for subtracting a variable G from a variable F to produce a variable P as a subtraction result. Each of the variables F, G, and P has zeroth and eighth bits.

At a bottom part of the figure, instruction codes are illustrated for the sentences i and ii.

Figure 17A:
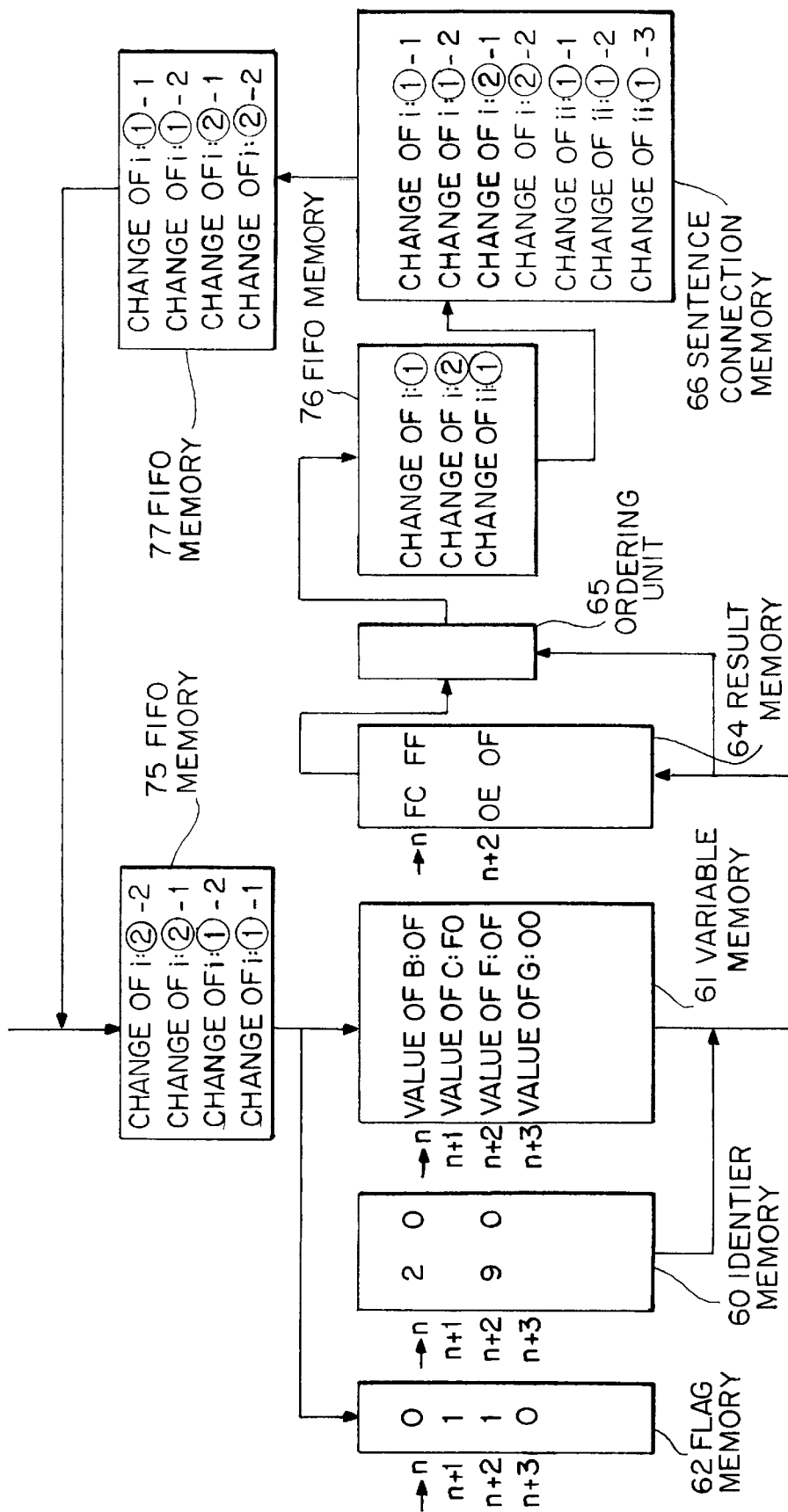
FIGS. 17(a) and (b), when combined together, show a diagram for use in describing operation of the logic simulator illustrated in FIG. 15.
Figure 17B:
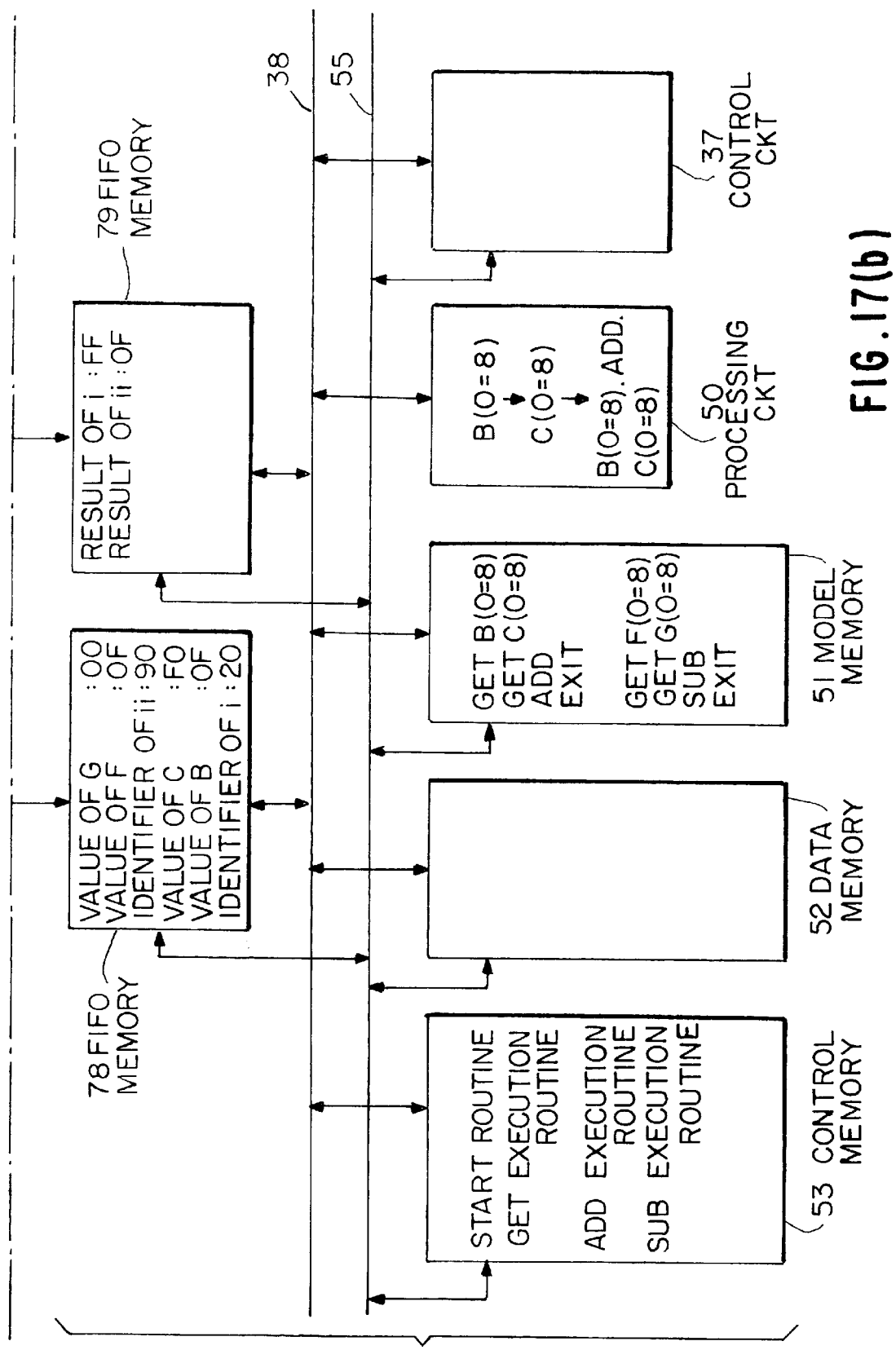

Referring to FIGS. 17(a) and (b), description will proceed to operation of the logic simulator illustrated in FIG. 15. It will be assumed that the logic simulator simulates the adding and the subtracting circuits in compliance with the sentences i and ii.

It will also be assumed that, before simulation is started for the adding and the subtracting circuits, the memories of the logic simulator are preliminarily loaded with various data which are necessary for the simulation of the adding and the subtracting circuits as follows. The variable memory 61 preliminarily memorizes values "0F" (hexadecimal notation), "F0", "0F", and "00" for the variables B, C, F, and G at its addresses n, n+1, n+2, and n+3. The identifier memory 60 memorizes an identifier "20" for the sentence i at its address n and another identifier "90" for the sentence ii at its address n+2. The flag memory 62 memorizes a flag "1" at its address n+1 to indicate a change of the value C of the sentence i. The flag memory 62 furthermore memorizes a flag "1" at its address n+2 to indicate a change of the value F of the sentence ii. The result memory 64 memorizes an initial result value "FC" as an output value of the sentence i at its address n and another initial result value "0E" as another output value of the sentence ii at its address n+2. The sentence connection memory 66 memorizes destinations of the sentences i and ii. The destinations will become clear as the description proceeds.

In the sentence calculating unit 63, the model memory 51 memorizes the codes for the sentences i and ii that are illustrated at the bottom of FIG. 16. For example, a code GET B (0=8) for the sentence i is memorized in a first specific memory region of the model memory 51 that is assigned with a first specific memory address "20" of the memory 51. A code GET F (0=8) for the sentence ii is memorized in a specific memory region of the model memory 51 that has a second specific memory address "90" of the model memory 51. The control memory 53 memorizes various routines, such as an ADD execution routine and a SUB execution routine.

Referring afresh to FIG. 18 in addition to FIGS. 17(a) and (b), operation of the logic simulator is carried out as follows.

(1) A simulation controller (not shown) reads, as a read-out identifier, the identifier "20" out of a memory region of the address n of the identifier memory 60 and deliver the read-out identifier "20" to the FIFO memory 78. Simultaneously, the simulation controller reads, as a read-out flag, the flag out of a memory region of address n of the flag memory 62 to check whether or not the read-out flag indicates "1". Furthermore, the simulation controller successively reads the values of the variables B and C out of memory regions of the addresses n and n+1 to deliver the values of the variables B and C to the FIFO memory 78.

As a result, the FIFO memory 78 memorizes the identifier "20" and the values "0F" and "F0" of the variables B and C of the sentence i while operation proceeds from the address n to the address n+1 of the variable memory 61. Such a state of the FIFO memory 78 is indicated in FIG. 18 by "i" in a rectangle along a bottom line. An upper byte "2" of the identifier "20" indicates the first specific memory address of the model memory 51 as a first start address of the codes for the sentence i.

(2) Inasmuch as the read-out flag indicates "1" when the read-out flag is read out of a memory region of the address n+1 of the flag memory 62, the simulation controller judges that the value of the variable C of the sentence i is changed. The simulation controller supplies an execution command to the sentence calculating unit 63 to make the sentence calculating unit 63 calculate a result value in compliance with the sentence i and by using the values of the variables of the sentence i. Operation of the sentence calculating unit 63 further proceeds as follows. The FIFO memory 78 now memorizes the identifier "90" and the values "0F" and "00" of the variables F and G of the sentence ii as illustrated in FIG. 18 by "ii" in another rectangle in the bottom line.

When the control circuit 37 of the sentence calculating unit 63 receives the execution command, the control circuit 37 refers to a start routine and reads the first start address out of the FIFO memory 78 as a read-out address on the basis of the start routine. The first start address is represented by the upper byte of the identifier "20" as mentioned above.

After the first start address is read out of the FIFO memory 78, operation of the sentence calculating unit 63 is carried out in the manner similar to the logic simulator described with reference to FIG. 9. As a result, calculation of B (0=8) ADD C (0=8) comes to an end with a calculated result value "FF" stored in the FIFO memory 79 as the value of the variable A (that is, a result of the sentence i).

When operation of the sentence calculating unit 63 comes to an end for the sentence i, the identifier "90" and the values "0F" and "00" of the variables F and G of the sentence ii are read out of the FIFO memory 78 and are processed into a calculated result value "0F" in compliance with the sentence ii in the similar manner. The calculated result value "0F" is memorized in the FIFO memory 79 as the value of the variable P (that is, a result of the sentence ii).

Thus, in the sentence calculating unit 63, values of variables for each of several sentences are successively read out of the FIFO memory 78 and are successively processed in compliance with the sentences into calculated result values to be stored in the FIFO memory 79 in the manner depicted in FIG. 18 by "i" and "ii" in rectangles along a third line as counted from the bottom line.

(3) The calculated result value "FF" is read out of the FIFO memory 79 and stored in the result memory 64.

In the meantime, the ordering unit 65 compares the calculated result value "FF" with the initial result value "FC". As a result, the ordering unit 76 finds a change in each of an LSB ① of the calculated result value "FF" and a second bit ② counted from the LSB. The ordering unit 65 gives an order or a serial number to such changed bits, such as the LSB ① and the second bit ② of the calculated result value "FF" to output the changed bits in a given order. For example, the changed bits are successively outputted from an LSB side of the calculated result value towards an MSB of the calculated result value together with the calculated result value to be stored in the FIFO memory 76. The order is depicted in FIG. 17(a) by a numeral connected by a hyphen to each encircled numeral.

When ordering operation comes to an end for the sentence i, the ordering unit 65 gives an order to changed bits of the calculated result value for the sentence ii in the similar manner.

(4) The simulation controller searches for a new destination of the sentence i on the basis of the changed bits ① and ② of the sentence i that is stored in the FIFO memory 76. The FIFO memory 76 has a state depicted in FIG. 18 by "i" in a rectangle in a fourth line from the bottom line. Inasmuch as a plurality of bits for the destinations corresponds to one bit of an output signal of the FIFO memory 76, the simulation controller searches all of the destinations ①–1, ①–2, ②–1, and ②–2 related to the changed bits ① and ②. All of the destinations ①–1, ①–2, ②–1, and ②–2 are successively stored in the FIFO memory 77 together with the calculated result value. After storage, the FIFO memory 77 is put into a state depicted by "i" in a rectangle in a fifth line from the bottom line, namely, in a second line as counted from the top of the figure.

(5) The destinations and the calculated result value are successively stored in the FIFO memory 75.

What is claimed is:

1. A logic simulator for simulating a logic circuit defined by a plurality of sentences, each sentence being identified by an identifier and comprising at least one operator and at least two variables which are operated on according to said at least one operator, said logic simulator comprising:

an identifier memory for memorizing a plurality of identifiers each specifying one of said sentences, respectively;

a model memory for memorizing a plurality of operators which carry out operations specified by said sentences;

a variable memory for memorizing a plurality of initial values of the variables specified by said sentences;

a flag memory for memorizing a plurality of flags in correspondence with said sentences, each of said flags being indicative of whether or not said initial values of the variables specified by each of said sentences are changed during said simulation of said sentences;

a sentence calculating means connected to said identifier memory, said model memory, said variable memory, and said flag memory for carrying out calculation on one of said sentences at a time only when a change is indicated by one of said flags that corresponds to said one of said sentences, said sentence calculating means producing a result of said calculation based on at least one of said operators and at least two of said initial values of said variable, said at least one of said operators and said at least two of said initial values of said variables being specified by said one of said sentences;

a result memory for memorizing an initial result value; and substituting means connected to said result memory and said sentence calculating means for substituting said result of said calculation for said initial result value.

2. A logic simulator as claimed in claim 1, wherein:

said identifier memory is for producing one of said identifiers at a time for specifying said one of said sentences;

said model memory being connected to said identifier memory and being responsive to said one of said sentences for producing said at least one of said operators.

3. A logic simulator as claimed in claim 2, further comprising:

a connection memory connected to said identifier memory, said variable memory, and said flag memory for memorizing a connection datum between said one of said sentences and a different one of said sentences;

said identifier memory being for producing a different one of said identifiers for identifying said different one of said sentences when accessed by said sentence calculating means;

said substituting means being connected to said connection memory to substitute said result of said calculation for one of said initial values on the basis of both said connection datum and said result of said calculation and to make one of said flags indicate a change in said one of said initial values.

4. A logic simulator as claimed in claim 3, each of said initial values being represented by a plurality of bits, said logic simulator further comprising an ordering unit, connected to said sentence calculating unit and said result memory, for ordering the bits of said result of said calculation in a predetermined manner when said result of said calculation differs from said initial result values.

5. A logic simulator for simulating a logic circuit defined by a first plurality of sentences, each sentence being identified by an identifier and comprising at least one operator and at least two variables which are operated on according to said at least one operator, said logic simulator comprising:

an identifier memory for memorizing a plurality of identifiers specifying said sentences, respectively;

a model memory for memorizing a plurality of operators which are for carrying out operations specified by said sentences;

a variable memory for memorizing a plurality of initial values of the variables specified by said sentences;

a flag memory for memorizing a plurality of flags equal in number to said initial values, said flags being indicative of whether or not said initial values are changed during simulation of said sentences, respectively;

sentence calculating means connected to said identifier memory, said model memory, said variable memory, and said flag memory for calculating a predetermined plural number of sentences of said first plurality of sentences when a change is indicated by one of said flags in at least one of said initial values of the variables specified by one of said predetermined plural number of sentences, said predetermined plural number of sentences being a second plurality in number and consecutively used during progress of simulation, where said second plurality is less than said first plurality, said sentence calculating means calculating one of said predetermined plural number of sentences at a time to produce a result of calculation based on at least one of said operators and at least two of said initial values of said variables, said at least one of said operators and said at least two of said initial values of said variables being specified by said one of the predetermined plural number of sentences;

a result memory for memorizing an initial result value; and substituting means connected to said result memory and said calculating means for substituting said result of calculation for said initial result value.

6. A logic simulator as claimed in claim 5, wherein:

said identifier memory is for producing the identifiers, equal in number to said second plurality, at a time for specifying said predetermined plural number of sentences, respectively, when controlled by said sentence calculating means;

said variable memory being connected to said identifier memory to successively produce the initial values of the variables specified by said predetermined plural number of sentences, when controlled by said sentence calculating means; and said sentence calculating means further comprising;

an input first-in first-out memory connected to said variable memory for memorizing as memorized values, the initial values of the variables specified by said predetermined plural number of sentences; and a sentence calculating unit connected to said model memory, said flag memory, and said input first-in first-out memory for successively calculating said predetermined plural number of sentences when changes are indicated by at least one of said flags in the initial values of the variables specified by said predetermined plural number of said sentences, said sentence calculating unit producing a succession of results of calculation based on said memorized values and a plurality of the operators which are specified by said predetermined plural number of sentences among the operators memorized in said model memory;

said result memory being for memorizing a plurality of initial result values for said predetermined plural number of sentences;

an output first-in first-out memory connected to said sentence calculating unit for memorizing said result of calculation as memorized result; and said substituting means being connected to said result memory and said output first-in first-out memory for substituting said memorized results for said initial result values.

\* \* \* \* \*